(12) United States Patent
Lee et al.

(10) Patent No.: US 12,211,745 B2
(45) Date of Patent: Jan. 28, 2025

(54) METHODS OF FABRICATING SEMICONDUCTOR DEVICES

(71) Applicant: Samsung Electronics Co., Ltd., Suwon-si (KR)

(72) Inventors: Uihyoung Lee, Hwaseong-si (KR); Honyun Park, Hwaseong-si (KR); Jongseok Lee, Hwaseong-si (KR); Sewan Kim, Suwon-si (KR); Taesung Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 434 days.

(21) Appl. No.: 17/558,699

(22) Filed: Dec. 22, 2021

(65) Prior Publication Data
US 2022/0359282 A1 Nov. 10, 2022

(30) Foreign Application Priority Data

May 4, 2021 (KR) ........................ 10-2021-0057688

(51) Int. Cl.
*H01L 21/768* (2006.01)
*H01L 21/285* (2006.01)

(52) U.S. Cl.
CPC .... *H01L 21/76877* (2013.01); *H01L 21/2855* (2013.01); *H01L 21/76802* (2013.01); *H01L 21/7684* (2013.01); *H01L 21/76843* (2013.01)

(58) Field of Classification Search
CPC ........... H01L 21/76877; H01L 21/2855; H01L 21/7684; H01L 21/76847; H01L 21/76849; H01L 21/76862; H01L 21/76802; H01L 21/76874

See application file for complete search history.

(56) References Cited

U.S. PATENT DOCUMENTS

| | | | |
|---|---|---|---|
| 6,193,855 B1 | 2/2001 | Gopalraja et al. | |
| 6,220,204 B1 | 4/2001 | Makino et al. | |
| 7,964,504 B1 | 6/2011 | Shaviv et al. | |
| 8,252,690 B2 | 8/2012 | Su et al. | |
| 8,846,451 B2 | 9/2014 | Ritchie et al. | |
| 9,812,331 B2 | 11/2017 | Lee et al. | |
| 2001/0003607 A1 | 6/2001 | Gopalraja et al. | |
| 2003/0034244 A1* | 2/2003 | Yasar | H01L 21/76843 257/E21.585 |

(Continued)

*Primary Examiner* — Latanya N Crawford Eason
(74) *Attorney, Agent, or Firm* — Wolf, Greenfield & Sacks, P.C.

(57) ABSTRACT

A method of fabricating a semiconductor device includes forming a dielectric layer on a lower structure. The method includes forming an opening to penetrate through the dielectric layer. The method includes alternately repeating a first operation, in which a first sputtering deposition process is performed to form a first metal pattern in the opening, and a second operation, in which a second sputtering deposition process is performed to form a second metal pattern in the opening, two or more times to form a first metal layer. The method includes forming a second metal layer on the first metal layer in an electroplating manner, and planarizing the first and second metal layers. Moreover, first and second process times, during which the first sputtering deposition process and the second sputtering deposition process, respectively, are performed, are each about five seconds or less.

19 Claims, 17 Drawing Sheets

(56) References Cited

U.S. PATENT DOCUMENTS

| | | |
|---|---|---|
| 2008/0190760 A1 | 8/2008 | Tang et al. |
| 2010/0096253 A1 | 4/2010 | Cao et al. |
| 2012/0070982 A1 | 3/2012 | Yu et al. |
| 2013/0237053 A1* | 9/2013 | Ishizaka ............ H01L 21/76865 438/642 |
| 2013/0264620 A1* | 10/2013 | Yu ....................... H01L 23/5329 438/653 |
| 2016/0053366 A1 | 2/2016 | Stowell et al. |
| 2016/0322255 A1 | 11/2016 | Chiang et al. |

* cited by examiner

METHODS OF FABRICATING SEMICONDUCTOR DEVICES

CROSS-REFERENCE TO RELATED APPLICATION(S)

This application claims the benefit of priority to Korean Patent Application No. 10-2021-0057688, filed on May 4, 2021, in the Korean Intellectual Property Office, the disclosure of which is incorporated herein by reference in its entirety.

BACKGROUND

The present disclosure relates to methods of fabricating semiconductor devices. As the integration density of semiconductor devices increases, line widths of metal interconnections have been reduced. Various metal deposition methods, such as a method of filling a recessed region with a metal material, have been developed to form a metal interconnection which is difficult to be patterned due to a narrow line width thereof.

Since a critical dimension (CD) of a recessed region for forming a metal interconnection having a fine line width is significantly small, an entrance of the recessed region may be clogged during metal deposition. In this case, voids may be formed in the recessed region such that it may be difficult for a semiconductor device to perform stable operations.

SUMMARY

Example embodiments provide a method of fabricating a semiconductor device having improved reliability.

According to an example embodiment, a method of fabricating a semiconductor device includes: forming a dielectric layer on a lower structure; forming an opening to penetrate through the dielectric layer; and forming a first metal layer along a sidewall of the dielectric layer, an upper surface of the lower structure, and an upper surface of the dielectric layer. The forming of the first metal layer includes: performing a first sputtering deposition process using a first bias voltage to form a first metal pattern including a first portion on the upper surface of the dielectric layer outside of the opening, and a second portion in the opening; performing a second sputtering deposition process using a second bias voltage, higher than the first bias voltage, such that the first portion of the first metal pattern is partially etched and a metal is deposited in the opening by resputtering the second portion of the first metal pattern to form a second metal pattern; and repeatedly performing the first sputtering deposition process and the second sputtering deposition process two or more times. The first metal layer includes first and second metal portions in the opening, the second metal portion extending upward from the first metal portion. The first metal portion has a first thickness in a lower portion of the opening in a first direction, perpendicular to the upper surface of the lower structure. The second metal portion has a second thickness, smaller than the first thickness, in a second direction, perpendicular to the sidewall of the dielectric layer.

According to an example embodiment, a method of fabricating a semiconductor device includes: forming a dielectric layer on a lower structure; forming an opening to penetrate through the dielectric layer; alternately repeating a first operation, in which a first sputtering deposition process using a first bias voltage is performed to form a first metal pattern along an upper surface of the lower structure and a sidewall and an upper surface of the dielectric layer, and a second operation, in which a second sputtering deposition process using a second bias voltage, higher than the first bias voltage, is performed to form a second metal pattern in the opening and on the upper surface of the dielectric layer, two or more times to form a first metal layer; forming a second metal layer on the first metal layer using electroplating; and planarizing the first and second metal layers. First and second process times, during which the first sputtering deposition process and the second sputtering deposition process, respectively, are performed, are each about five seconds or less.

According to an example embodiment, a method of fabricating a semiconductor device includes: forming a material layer having an opening; performing a first sputtering deposition process using a first bias voltage to form a first metal pattern in the opening and on an upper surface of the material layer; performing a second sputtering deposition process using a second bias voltage, higher than the first bias voltage, to form a second metal pattern in the opening and on the upper surface of the material layer; alternately repeating the forming of the first metal pattern and the forming of the second metal pattern two or more times to form a first metal layer; forming a second metal layer on the first metal layer using electroplating; and planarizing the first and second metal layers to form a metal structure in the opening. The first metal layer includes a first metal portion, in a lower portion of the opening, and a second metal portion in an upper portion of the opening, the second metal portion extending upward from the first metal portion. The first metal portion has a first thickness in a first direction perpendicular to the upper surface of the material layer. The second metal portion has a second thickness, smaller than the first thickness, in a second direction perpendicular to a sidewall of the material layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
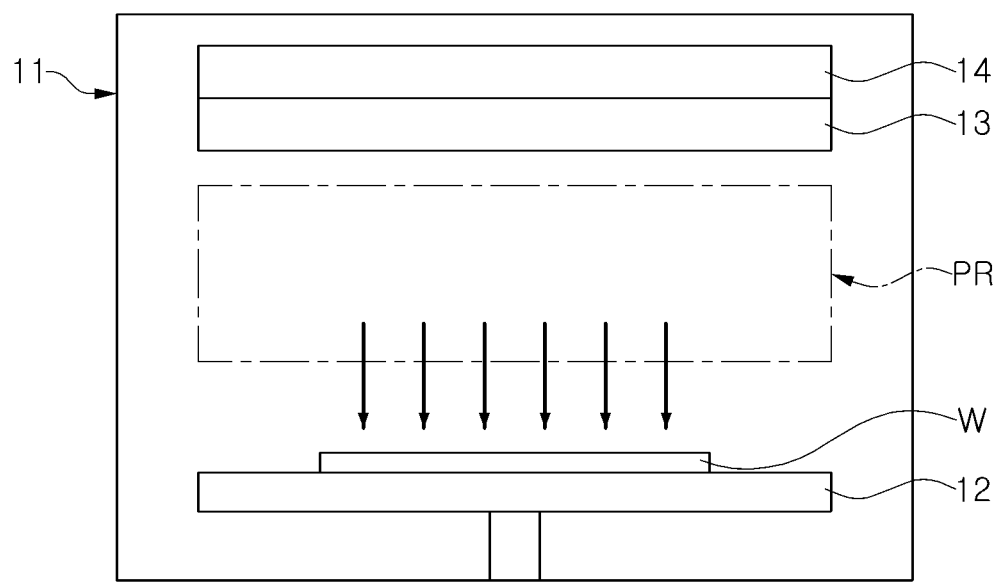
FIG. 1 is a schematic cross-sectional view of a physical vapor deposition apparatus in which a method of fabricating a semiconductor device according to example embodiments is performed.

FIG. 1 is a schematic cross-sectional view of a sputtering deposition apparatus in which a method of fabricating a semiconductor device according to example embodiments is performed.

Referring to FIG. 1, a sputtering deposition apparatus 1 may include a process chamber 11, a support 12 fixing (e.g., holding) a substrate W during a deposition process, a plasma generation unit PR generating plasma using a process gas, a target 13 supplying a metal material deposited on a wafer, and a magnetic material 14 disposed on the target 13.

In the process chamber 11, a sputtering deposition process may be performed to deposit a metal material on the substrate W. The target 13 may be disposed in an upper region of the plasma generator PR. The target 13 may be disposed to face the substrate W disposed on the support 12. The target 13 may be, for example, a metal target including a metal material. For example, the target 13 may include copper or the like, but example embodiments are not limited thereto. The target 13 may include various types of deposition material.

The process gas supplied into the process chamber 11 to be excited to a plasma state may include, for example, an inert gas such as argon (Ar). For example, argon gas may be generated in a plasma state in which electrons and cations are present together in the plasma generation unit PR. Argon cations may collide with the target 13, so that metal atoms of the target 13, for example, copper atoms may be torn away. The torn-away metal atoms may be deposited on the substrate W to form a metal layer on the substrate W.

The magnetic material 14 may generate a magnetic field. The magnetic field of the magnetic material 14 may increase the amount of generated argon cations. The magnetic material 14 may be disposed on the target 13, and may be rotated to generate a magnetic field having a uniform distribution.

Figure 2:
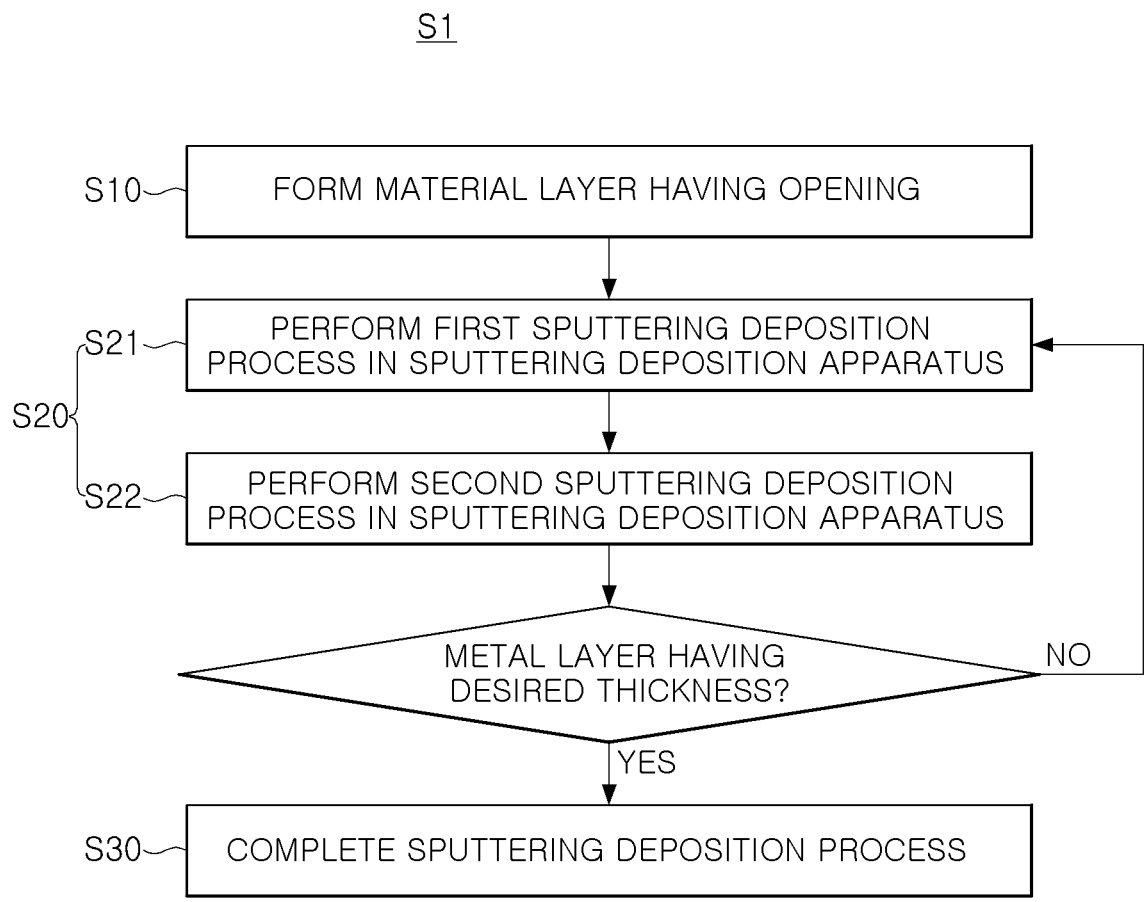
FIG. 2 is a flowchart illustrating a method of fabricating a semiconductor device according to example embodiments.

FIG. 2 is a flowchart illustrating a method of fabricating a semiconductor device according to example embodiments.

Figure 3:
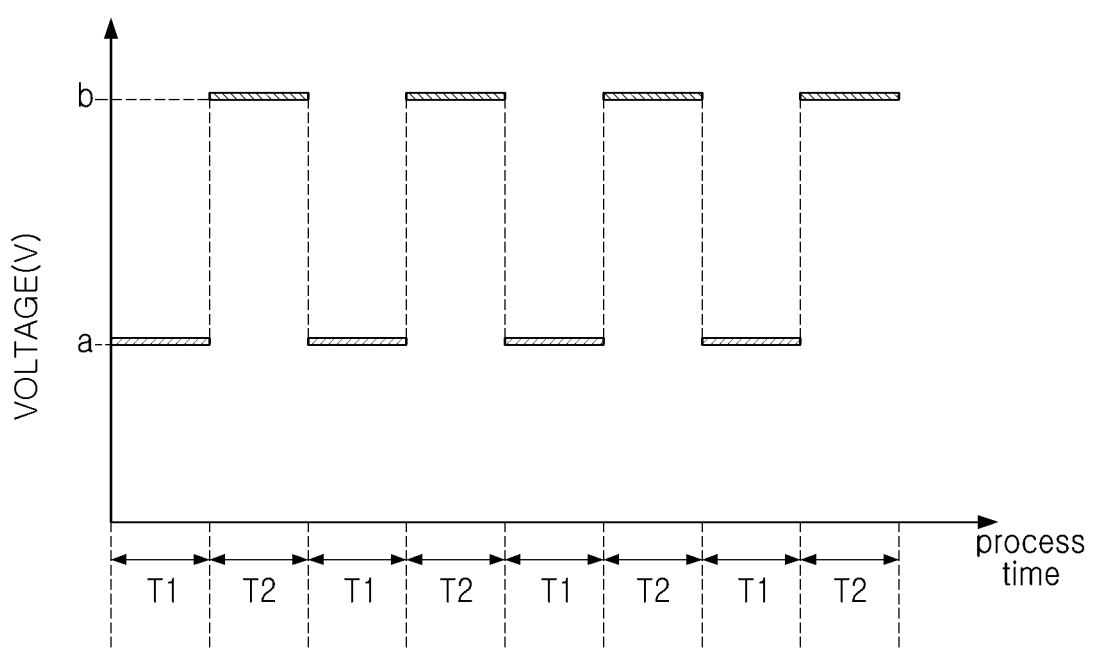
FIG. 3 is a graph illustrating a bias voltage applied over process time in a method of fabricating a semiconductor device according to example embodiments.

FIG. 3 is a graph illustrating a bias voltage applied over process time in a method of fabricating a semiconductor device according to example embodiments.

Referring to FIGS. 2 and 3, a method S1 of fabricating a semiconductor device may include operation S10, in which a material layer having an opening is formed, and operation S20 in which a first metal layer is formed along a sidewall and a lower surface of the opening and an upper surface of the material layer. The operation S20 may include operation S21, in which a first sputtering deposition process using a first bias voltage is performed in a sputtering deposition apparatus, and operation S22 in which a second sputtering deposition process using a second bias voltage, higher than the first bias voltage, is performed in the sputtering deposition apparatus. The operation S21 and the operation S22 may be alternately repeated two or more times until a first metal layer having a desired vertical thickness is formed.

When the first metal layer having a desired (e.g., predetermined) vertical thickness is formed in the opening, the sputtering deposition process may be finished in operation S30.

In operation S10, the material layer may be a dielectric layer including a dielectric material or may be a semiconductor layer. The dielectric layer may include, for example, at least one of various insulating materials such as silicon oxide, silicon nitride, silicon oxynitride, and a low-k dielectric. The semiconductor layer may include a semiconductor material such as a group IV semiconductor, a group III-V compound semiconductor, or a group II-VI compound semiconductor. For example, the group IV semiconductor may include silicon, germanium, or silicon-germanium.

In operation S20, the first metal layer may be deposited by a sputtering deposition process. The sputtering deposition process may be, for example, a physical vapor deposition (PVD) process.

The first sputtering process S21 using the first bias voltage "a" (FIG. 3) may be performed for a short time. For example, the first sputtering process S21 may be performed for a time during which a rotation period of the magnetic material 14 (see FIG. 1) of the sputtering deposition apparatus is physically significantly reduced. However, a process time T1 (FIG. 3) during which the first sputtering process S21 is performed is not limited to the time during which the rotation period of the magnetic material 14 is physically significantly reduced, and may be a short time around the above-mentioned time. The process time T1 during which the first sputtering process S21 is performed may be, for example, about 5 seconds or less. The process time T1 during which the first sputtering process S21 is performed may be, for example, about 2 seconds or less.

The first sputtering process S21 may be referred to as a sacrificial metal pattern deposition process. In the first sputtering process S21, since the sputtering process is performed using a relatively low bias voltage for a short time, the metal pattern may be deposited in the opening such that the entrance of the opening is not clogged, and may be deposited on an upper surface of the material layer to have a predetermined thickness. A first portion of the metal pattern, deposited on the upper surface of the material layer to have the predetermined thickness, may be etched in the second sputtering process S22. When the thickness of the first portion of the metal pattern has an appropriate level, the first portion of the metal pattern may not be etched together with an upper region of the material layer in the second sputtering process S22. Therefore, the first portion of the metal pattern may serve as a sacrificial layer.

The second sputtering process S22 using a second bias voltage "b" (FIG. 3) higher than the first bias voltage "a" may be performed for a short time. For example, the second sputtering process S22 may be performed for a time during which the rotation period of the magnetic material 14 (see FIG. 1) is physically significantly reduced. However, process time t2 during which the second sputtering process S22 is performed is not limited to the time during which the rotation period of the magnetic material 14 is physically significantly reduced, and may be a short time around the above-mentioned time. The process time t2 during which the second sputtering process S22 is performed may be, for example, about 5 seconds or less. The process time t2 during which the second sputtering process S22 is performed may be, for example, about 2 seconds or less. By the second sputtering process S22, the first portion of the metal pattern deposited on the upper surface of the material layer may be etched and the second portion of the metal pattern deposited in the opening may be resputtered to deposit a metal on a sidewall of the opening. Since the second sputtering process S22 is performed using a relatively high second bias voltage "b," straightness of metal ions may be greater than that in the first sputtering process S21.

In the present disclosure, since each of the first sputtering process S21 and the second sputtering process S22 is repeatedly performed for a short time, the first metal layer including a first portion having a first thickness on the lower surface of the opening and a second portion having a second thickness, smaller than the first thickness, on the sidewall of the opening may be formed. A thickness of the first portion of the metal pattern, disposed on the upper surface of the material layer, other than an opening region, may be maintained in a range of substantially the same thickness.

Each of the process times T1 and T2 during which the first sputtering process S21 and the second sputtering process S22 are performed may be, for example, about 5 seconds or less. Each of the process times T1 and T2 during which the first sputtering process S21 and the second sputtering process S22 are performed may be, for example, about 2 seconds or less.

In the present disclosure, since the first sputtering process S21 is performed using the first bias voltage "a" for a short time, the entrance of the opening may be impeded/prevented from being clogged by an overhang structure. Accordingly, when the second sputtering process S22 using the second bias voltage "b" is performed, resputtering on the lower surface of the opening may be smoothly performed.

In the present disclosure, since the second sputtering process S22 is performed using the second bias voltage "b" for a short time, the first portion of the metal pattern formed on the upper surface of the material layer may be etched, but the material layer may not be etched together with the first portion of the metal pattern. Accordingly, the second bias voltage "b" of the second sputtering process S22 may be relatively higher than a bias voltage applied when a process time is long. For example, the second bias voltage "b" of the second sputtering process S22 may be higher than a bias voltage applied when each of the process times T1 and T2 is greater than about 5 seconds. That is, since a sacrificial metal layer is formed by the first sputtering process S21 and the second sputtering process S22 in which the second bias voltage "b" is applied for a short time is performed, straightness of metal ions may be improved, as compared to straightness when a sputtering process is performed for a time more than the time of the present disclosure.

The first metal layer may include a metal material, for example, copper.

Figure 4:
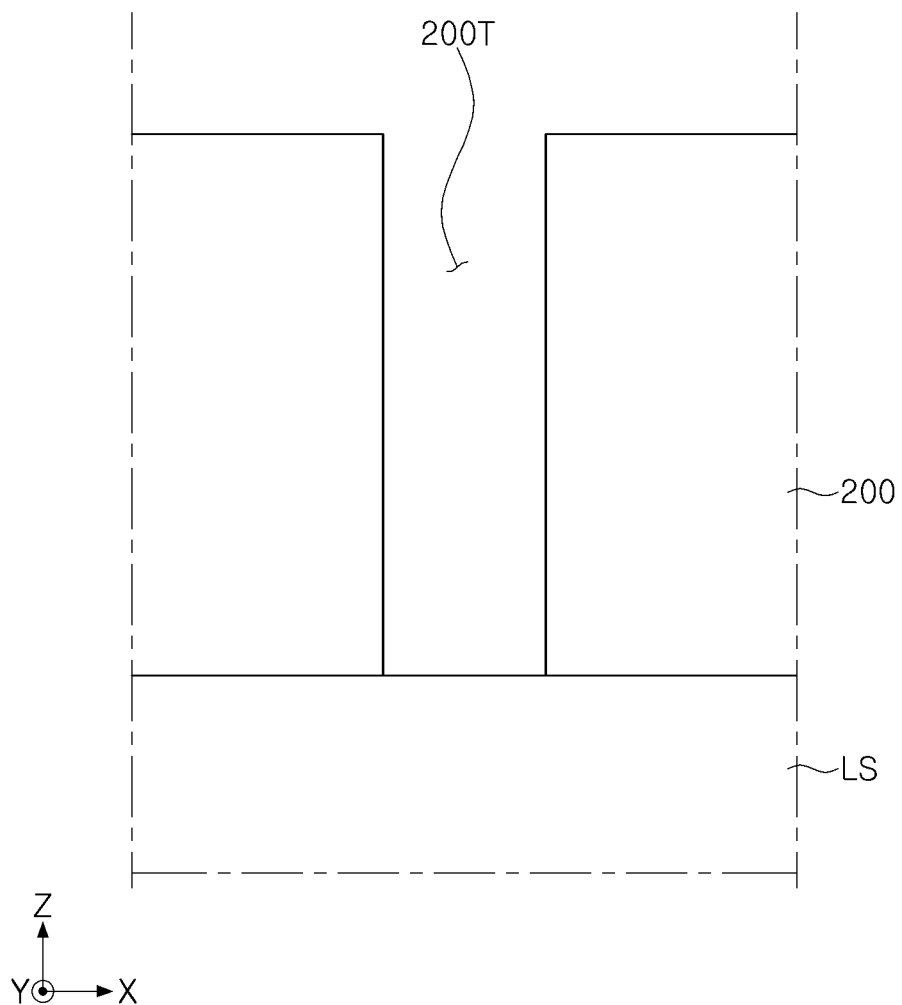
FIGS. 4 to 7 are process flow diagrams illustrating a method of fabricating a semiconductor device according to example embodiments.

FIG. 4 is a cross-sectional view illustrating a method of fabricating a semiconductor device according to example embodiments.

Referring to FIGS. 2 and 4, in operation S10, a material layer having an opening may be formed. In example embodiments, the operation S10 may include forming a lower structure LS, forming a material layer 200 on the lower structure LS, and forming an opening 200T to penetrate through the material layer 200. However, in other embodiments, the forming of the lower structure LS may be omitted.

The lower structure LS may include a data storage structure of a volatile memory device or a data storage structure of a nonvolatile memory device. For example, the lower structure LS may include a memory cell array including a data storage structure in a dynamic random access memory (DRAM), a memory cell array including a data storage structure in a flash memory, a logic circuit, or a sensor.

The material layer 200 formed on the lower structure LS may include an insulating (e.g., dielectric) material, for example, silicon oxide, silicon nitride, silicon oxynitride, or the like.

Figure 5:
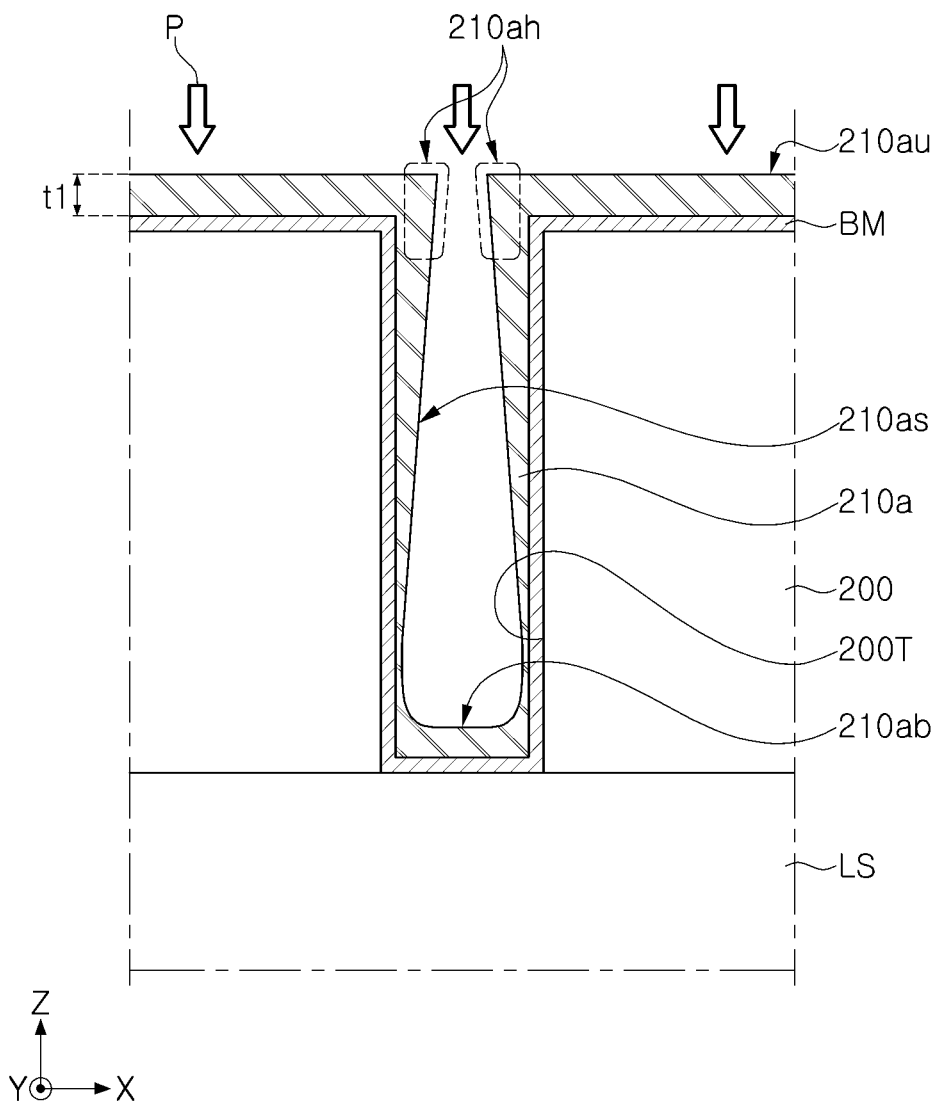

FIG. 5 is a cross-sectional view illustrating a method of fabricating a semiconductor device according to example embodiments.

Referring to FIGS. 2 and 5, in operation S21, a first sputtering deposition process using a first bias voltage may be performed in a sputtering deposition apparatus to form a first metal pattern 210a.

In an example embodiment, the method may further include forming a barrier metal layer BM between operation S10, in which the material layer having an opening is formed, and operation S20 in which the first metal layer is formed. The barrier metal layer BM may be formed to conformally cover the inner wall of the opening 200T. The barrier metal layer BM may be a diffusion barrier and may include, for example, a metal (for example, titanium (Ti), tantalum (Ta), or the like.) and/or a metal nitride (for example, titanium nitride (TiN), tantalum nitride (TaN), or the like).

A first metal pattern 210a may be formed by the first sputtering deposition process S21. The first metal pattern 210a may include a first portion 210au, formed on an upper surface of the material layer 200 in a region other than the opening 200T, and second portions 210as and 210ab formed in the opening 200T. The first metal pattern 210a may further include a third portion 210ah in a region in which the first portion 210au and the second portions 210as and 210ab are connected to each other.

At least a portion of the first portion 210au, disposed on the material layer 200, may be removed or etched by the second sputtering process S22. The first portion 210au, disposed on the material layer 200, may impede/prevent the material layer 200 from being removed by the second sputtering process S22.

The second portions 210as and 210ab, formed along an internal wall of the opening 200T, may include the first lower portion 210ab, disposed on a lower surface of the opening 200T, and a first side portion 210as disposed on the internal wall of the opening 200T.

The third portion 210ah may have a shape protruding further in a direction toward a vertical central axis of the opening 200T than the first side portion 210as of the second portions 210as and 210ab, for example, an overhang shape. In the present disclosure, the first sputtering process S21 may be performed for process time (T1 in FIG. 3) during which an entrance of the opening 200T is not completely clogged by the third portion 210ah. Accordingly, sputtering and re-sputtering processes in subsequent processes may be smoothly performed.

Figure 6:
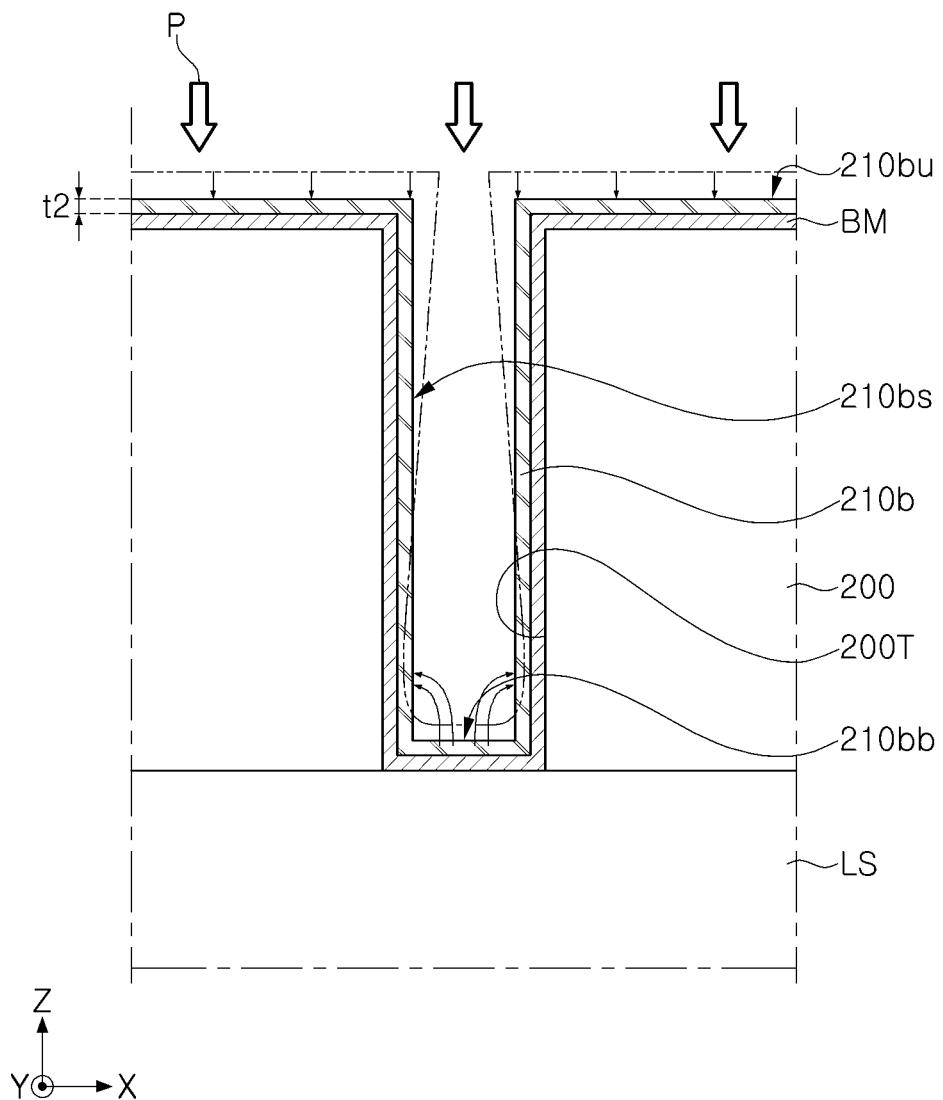

FIG. 6 is a cross-sectional view illustrating a method of fabricating a semiconductor device according to example embodiments.

Referring to FIGS. 2, 5, and 6, in operation S21, a second metal pattern 210b may be formed by performing a second sputtering deposition process using a second bias voltage, higher than a first bias voltage, in the sputtering deposition apparatus.

The second metal pattern 210b may include a first portion 210bu, formed on the upper surface of the material layer 200 in a region other than the opening 200T, and second portions 210bs and 210bb formed in the opening 200T. The second metal pattern 210b may be a pattern formed after the second sputtering deposition process S22 using the second bias voltage is performed on the first metal pattern 210a of the first sputtering deposition process S21. For example, the first portion 210*bu* and the second portions 210*bs* and 210*bb* of the second metal pattern 210*b* may be portions formed in regions corresponding to the first portion 210*au* and the second portions 210*as* and 210*ab* of the first metal pattern 210*a*, respectively.

At least a portion of the first portion 210*au* of the first metal pattern 210*a* may be etched by the second sputtering process S22. For example, a thickness t2 of the first portion 210*bu* of the second metal pattern 210*b* may be smaller than a thickness t1 of the first portion 210*au* of the first metal pattern 210*a*. The second sputtering process S22 may be performed for a process time (T2 of FIG. 3) during which the entire first portion 210*au* of the first metal pattern 210*a* may not be etched and the material layer 200 may be impeded/prevented from being etched.

The second portions 210*bs* and 210*bb* of the second metal pattern 210*b*, formed along the internal wall of the opening 200T, may include a second lower portion 210*bb*, disposed on a lower surface of the opening 200T, and a second side portion 210*bs* disposed on the internal wall of the opening 200T. The metal, sputtered in the lower portion 210*ab* of the first metal pattern 210*a*, may be deposited on a sidewall of the opening 200T by a resputtering process. A third portion 210*ah* of the first metal pattern 210*a* and at least a portion of the side portion 210*as* of the first metal pattern 210*a* may be etched to be removed due to the straightness of metal ions according to the second bias voltage. Accordingly, the side portions 210*bs* of the second metal pattern 210*b*, disposed along the internal wall of the opening 200T, may be conformally formed. The side portions 210*bs* of the second metal pattern 210*b* may be formed to have a substantially uniform thickness.

In the second sputtering process S22 performed using the second bias voltage for the process time T2 described in FIG. 3, the second bias voltage may be higher than, for example, a bias voltage when a sputtering process is performed for a relatively long process time of more than five seconds. Accordingly, the side portion of the second metal pattern formed along the sidewall of the opening 200T may be formed to be substantially uniform. In addition, since the second sputtering process S22 is performed for a short time, even when a relatively high bias voltage is applied, the entire first portion 210*au* of the first metal pattern 210*a* may not be etched and a thickness t2 of the first portion 210*bu* of the second metal pattern 210*b* may be maintained within a predetermined range.

Figure 7:
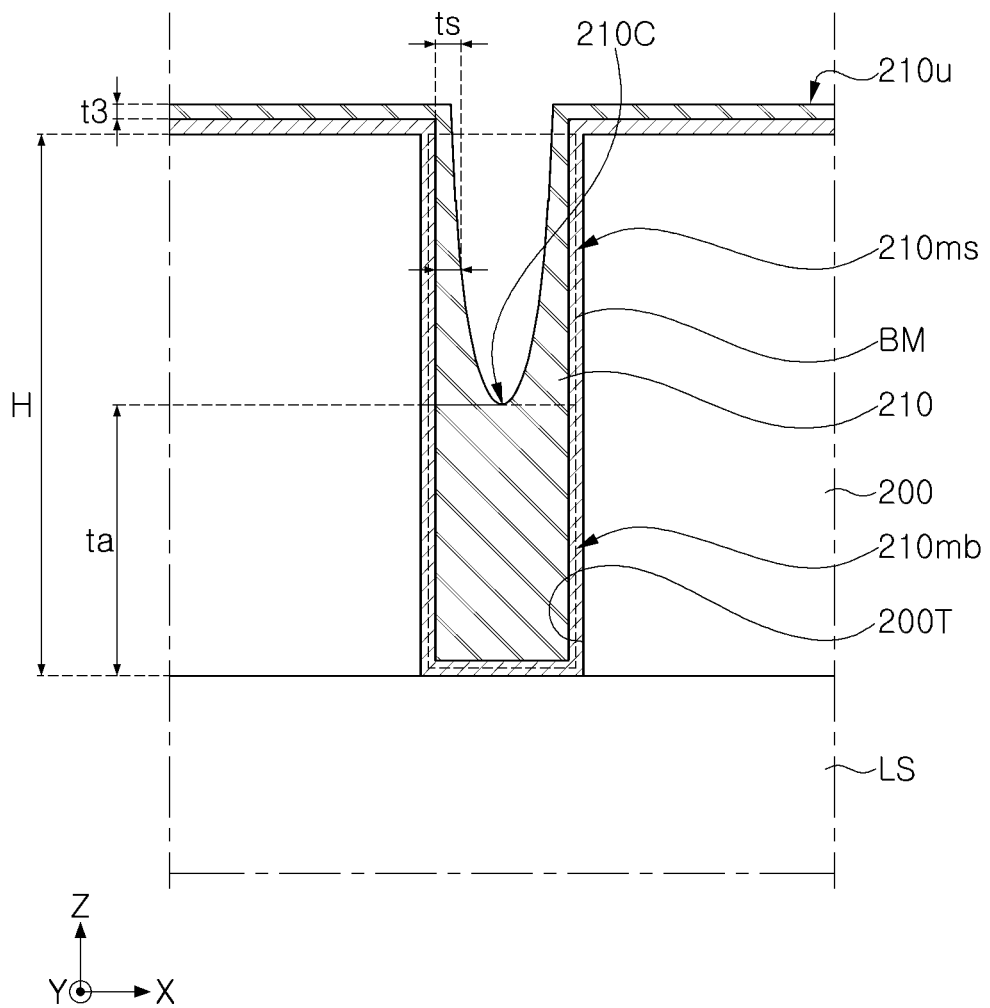

FIG. 7 is a cross-sectional view illustrating a method of fabricating a semiconductor device according to example embodiments.

Referring to FIGS. 2 and 7, operation S21, in which a first sputtering deposition process is performed, and operation S22, in which a second sputtering deposition process is performed, may be alternately repeated two or more times to form a first metal layer 210. When the first metal layer 210 having a desired (e.g., predetermined) vertical thickness to is formed in an opening 200T, the sputtering deposition process may be completed in operation S30. The vertical thickness ta may be a thickness at a vertical central axis of the opening 200T. The vertical central axis of the opening 200T may be an axis perpendicular to an upper surface of a lower structure LS and passing through a center between sidewalls of the opening 200T or passing through a center of a lower surface of the opening 200T.

The first metal layer 210 may include a first metal portion 210*mb*, in (e.g., filling) a portion of the opening 200T, and a second metal portion 210*ms* extending from the first metal portion 210*mb* and on (e.g., covering) a sidewall of the opening 200T at a higher level than the first metal portion 210*mb*. The first metal portion 210*mb* of the first metal layer 210 may be defined as a region filled with a metal material without an empty space in the opening 200T, and the second metal portion 210*ms* may be defined as a region in contact with an empty space, which is not filled with the first metal layer 210, of the opening 200T.

The first metal portion 210*mb* may have a first thickness ta in a central portion of a lower surface of the opening 200T in a direction (for example, a Z direction), perpendicular to an upper surface of the lower structure LS. The second metal portion 210*ms* may have a second thickness is smaller than the first thickness ta in a direction (for example, an X direction), perpendicular to the sidewall of the opening 200T.

The first metal layer 210 may be deposited along the lower surface and internal walls of the opening 200T, and may include an upwardly concave surface 210*c* formed to decrease in width as it approaches the lower surface of the opening 200T (e.g., the upper surface of the lower structure LS).

When operation S21, in which the first sputtering deposition process is performed, and operation S22, in which the second sputtering deposition process is performed, are alternately repeated two or more times, a metal may be deposited in a vertical direction (a Z direction) on a bottom surface of the opening 200T. In addition, the sidewall of the opening 200T may be formed such that the vertical thickness ta of the first portion 210*b* vertically stacked on the bottom surface of the opening 200T is greater than the thickness is of the second portion 210*s* disposed on the sidewall of the opening 200T in the X direction because the metal is repeatedly deposited by etching and resputtering an overhang structure such as the third portion 210*ah* of FIG. 5.

When operation S21, in which the first sputtering deposition process is performed, and operation S22, in which the second sputtering deposition process is performed, are alternately repeated two or more times, a thickness t3 of an upper portion 210*u* of the first metal layer 210 disposed on the upper surface of the material layer 200 may be substantially the same as a thickness t2 of a first portion 210*bu* (see FIG. 6) of the second metal pattern 210*b* (see FIG. 6), but example embodiments are not limited thereto. For example, the thickness t3 of the upper portion 210*u* of the first metal layer 210 may be smaller than the thickness t1 of the first portion 210*au* (see FIG. 5) of the first metal pattern 210*a* (see FIG. 5), and may be greater than the thickness t2 (see FIG. 6) of the first portion 210*bu* (see FIG. 6) of the second metal pattern 210*b* (see FIG. 6).

In the present disclosure, the vertical thickness ta of the first metal layer 210 may be defined as a vertical thickness of the first portion 210*b* of the first metal layer 210.

In an example, the vertical thickness ta of the first metal layer 210 may be less than or equal to, for example, about half (½) of the height H of the opening 200T.

In another example, the vertical thickness ta of the first metal layer 210 may be equal to or greater than about half (½) of a height H of the opening 200T, and may be smaller than the height H of the opening 200T.

In another example, the vertical thickness ta of the first metal layer 210 may be equal to the height H of the opening 200T or greater than the height H of the opening 200T.

Figure 8:
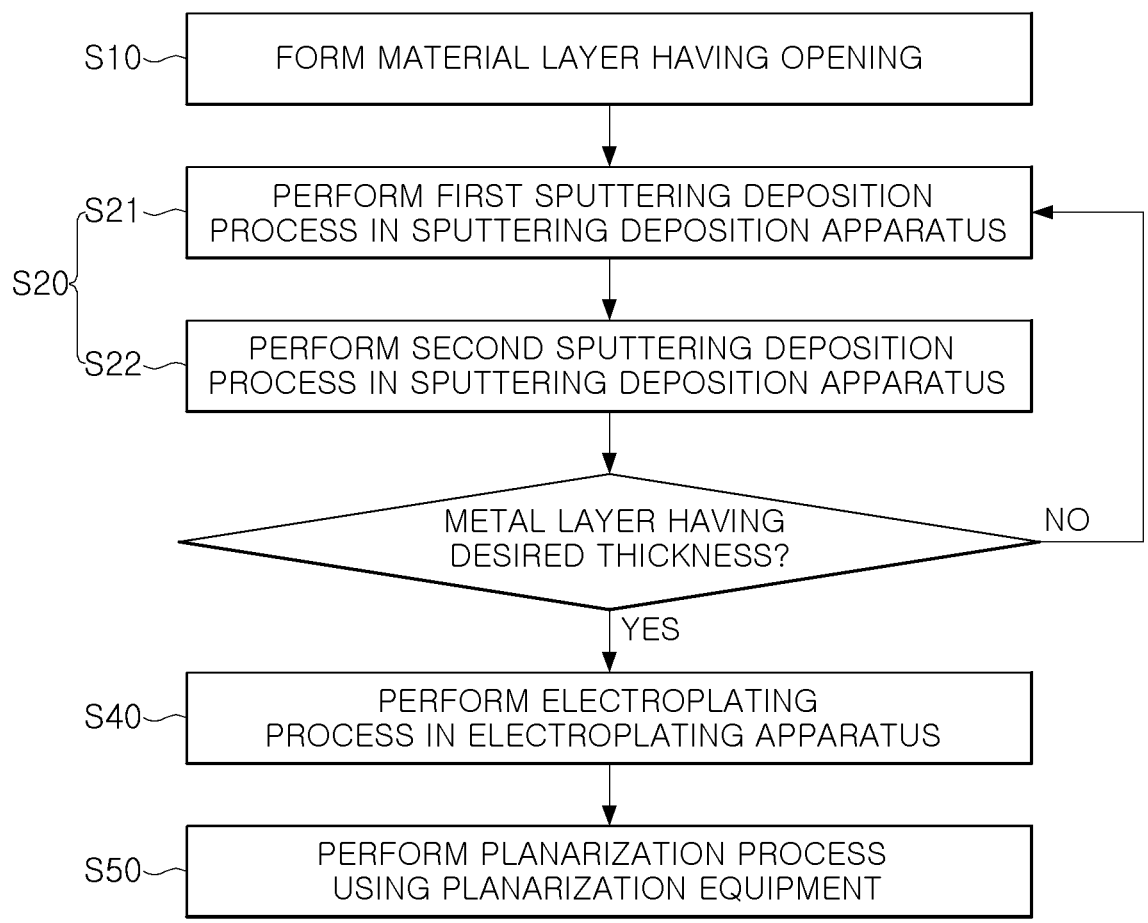
FIG. 8 is a flowchart illustrating a method of fabricating a semiconductor device according to example embodiments.

FIG. 8 is a flowchart illustrating a method of fabricating a semiconductor device according to example embodiments. In FIG. 8, a repetition of the same description as provided with reference to FIG. 2 may be omitted.

Referring to FIG. 8, a method S2 of fabricating a semiconductor device may include operation S10 in which a material layer having an opening is formed, operation S20 in which a first metal layer is formed along a sidewall and a lower surface of the opening and an upper surface of the material layer, and operation S40 in which an electroplating process is performed in an electroplating apparatus to form a second metal layer. In an example embodiment, the method S2 may further include operation S50 in which a planarization process is performed using planarization process equipment.

In operation S40, the electroplating process may be performed in the electroplating equipment. For example, after the first metal layer (210 in FIG. 7) is formed in the opening (200T in FIG. 7) of the material layer, an electroplating process may be performed to form a second metal layer. The first metal layer may be formed in a certain region of the opening using a sputtering deposition process, and the second metal layer may be formed in another region of the opening using an electroplating process. The second metal layer may include the same metal material as the first metal layer. For example, the second metal layer may include copper, or the like. In an example embodiment, operation S40 in which the second metal layer is formed by the electroplating process may be omitted. In this case, a planarization process may be performed in operation S50 after the first metal layer is formed.

When operation S20, in which the first metal layer is formed by the sputtering process, and operation S40, in which the second metal layer is formed by the electroplating process, are performed together, the first metal layer may be formed to have a height less than or equal to about half ($1/2$) of a height of the opening. The first metal layer may be formed to have a height less than or equal to about a quarter ($1/4$) of the height of the opening. After operation S20 in which the first metal layer is formed by the sputtering process, operation S40 in which the electroplating process is performed to form the second metal layer may be performed to reduce costs of the entire process of forming the metal layer in the opening.

Operation S50, in which the planarization process is performed using planarization process equipment, may be performed by, for example, a chemical mechanical planarization (CMP) process.

Figure 9:
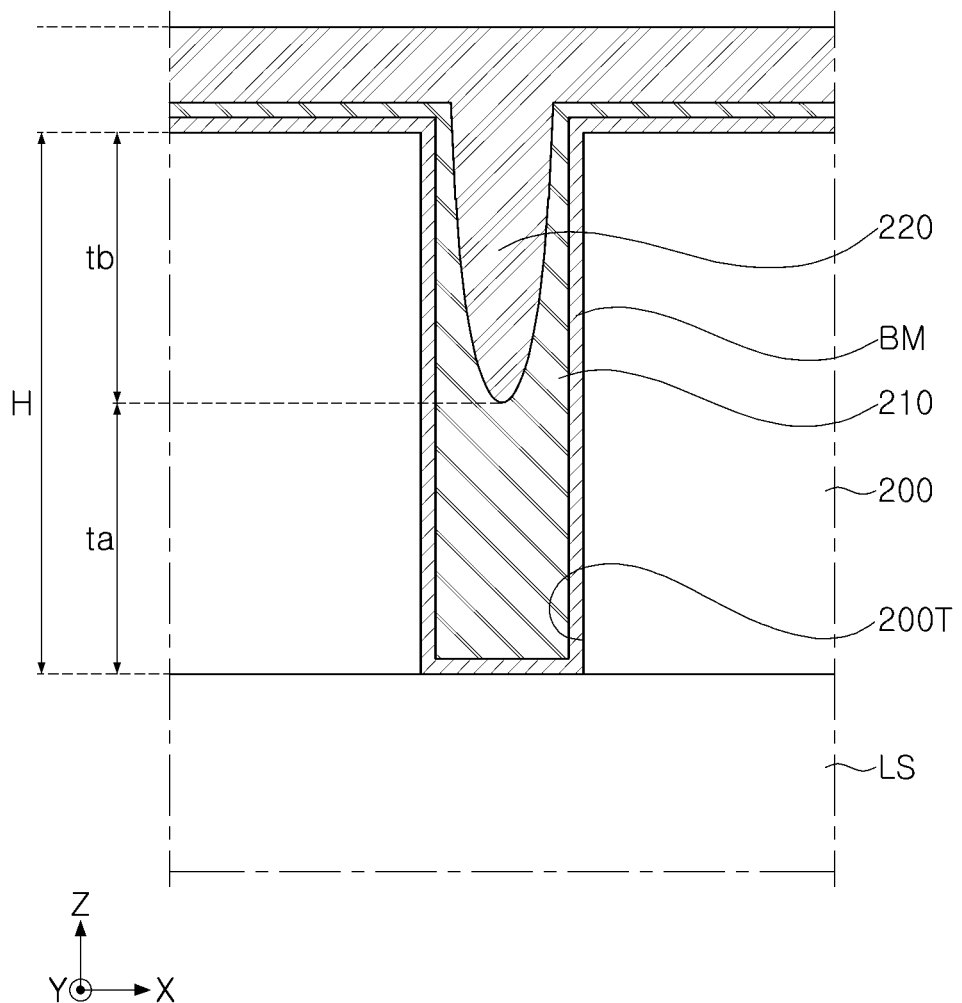
FIGS. 9 and 10 are process flow diagrams illustrating a method of fabricating a semiconductor device according to example embodiments.
Figure 10:
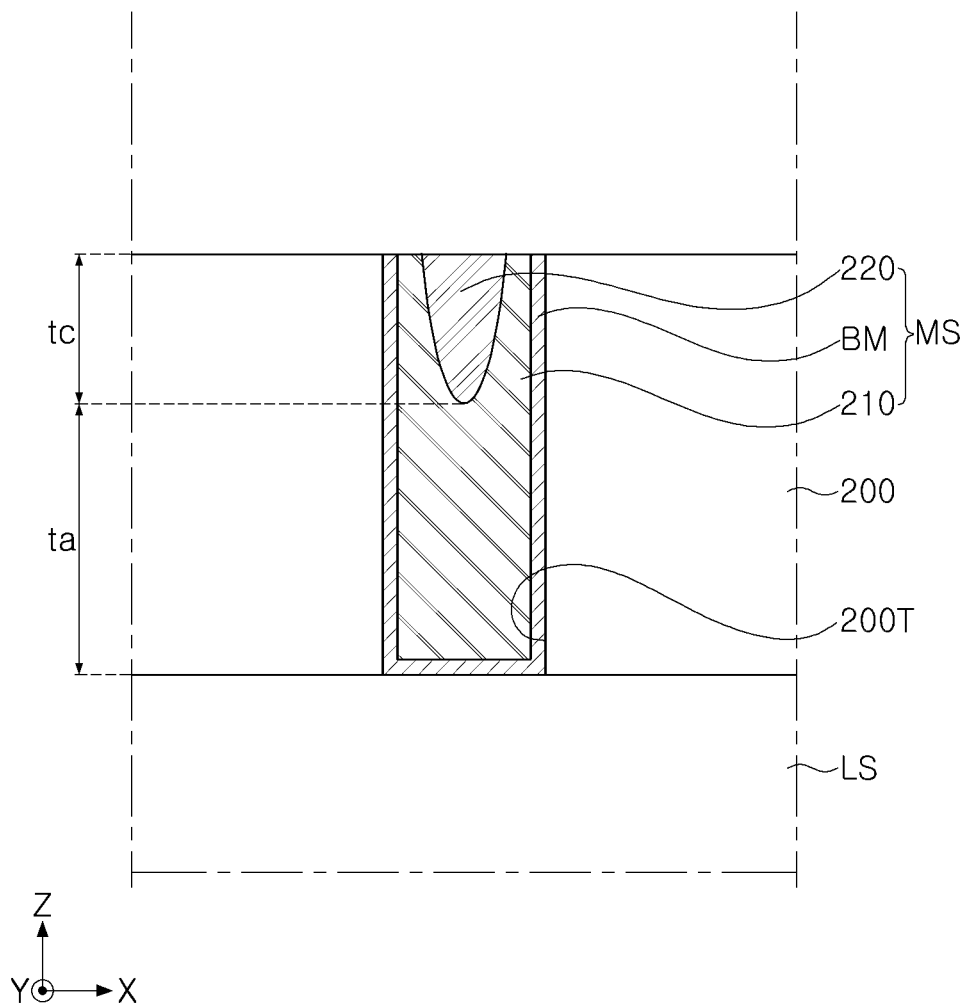

FIGS. 9 and 10 are process flow diagrams illustrating a method of fabricating a semiconductor device according to example embodiments. FIG. 9 illustrates operations subsequent to the process described with reference to FIG. 7.

Referring to FIGS. 8 and 9, in operation S40, the second metal layer 220 may be formed on the first metal layer 210 by an electroplating process. The second metal layer 220 may include the same metal material as the first metal layer 210 and may include, for example, copper.

When the second metal layer 220 is formed on the first metal layer 210 by the electroplating process, a vertical thickness ta of the first metal layer 210 may be less than or equal to, for example, about half ($1/2$) of the height H of the opening 200T. In this case, a vertical thickness tb of the second metal layer 220 in the Z direction, perpendicular to the upper surface of the lower structure LS may be greater than or equal to about half ($1/2$) of the height H of the opening 200T. A vertical thickness ta of the first metal layer 210 may be less than or equal to, for example, about a quarter ($1/4$) of the height H of the opening 200T. In this case, the vertical thickness tb of the second metal layer 220 may be greater than or equal to about three quarters ($3/4$) of the height H of the opening 200T. The vertical thickness ta of the first metal layer 210 and the vertical thickness tb of the second metal layer 220 may be the thicknesses at a vertical central axis of the opening 200T. The vertical central axis of the opening 200T may be an axis perpendicular to the upper surface of the lower structure LS and passing through a center between sidewalls of the opening 200T or passing through a center of the lower surface of the opening 200T.

Referring to FIGS. 8 and 10, in operation S50, a planarization process may be performed using planarization process equipment.

At least a portion of the material layer 200, the first metal layer 210, and the second metal layer 220, disposed in an upper region, may be removed by a planarization process. The first metal layer 210 and the second metal layer 220 may be planarized to form a metal structure MS in the opening 200T. The metal structure MS, formed after the planarization process, may include a first metal layer 210 and a second metal layer 220. In an example embodiment, the metal structure MS may further include a barrier metal layer BM. An upper surface of the material layer 200 may be exposed by the planarization process. At least a portion of the first metal layer 210 and an upper surface of the second metal layer 220 may be exposed by the planarization process.

A vertical thickness tc of the second metal layer 220 after the planarization process is illustrated as being less than the vertical thickness ta of the first metal layer 210, but example embodiments are not limited thereto. For example, the vertical thickness tc of the second metal layer 220 may be greater than the vertical thickness ta of the first metal layer 210.

Figure 11:
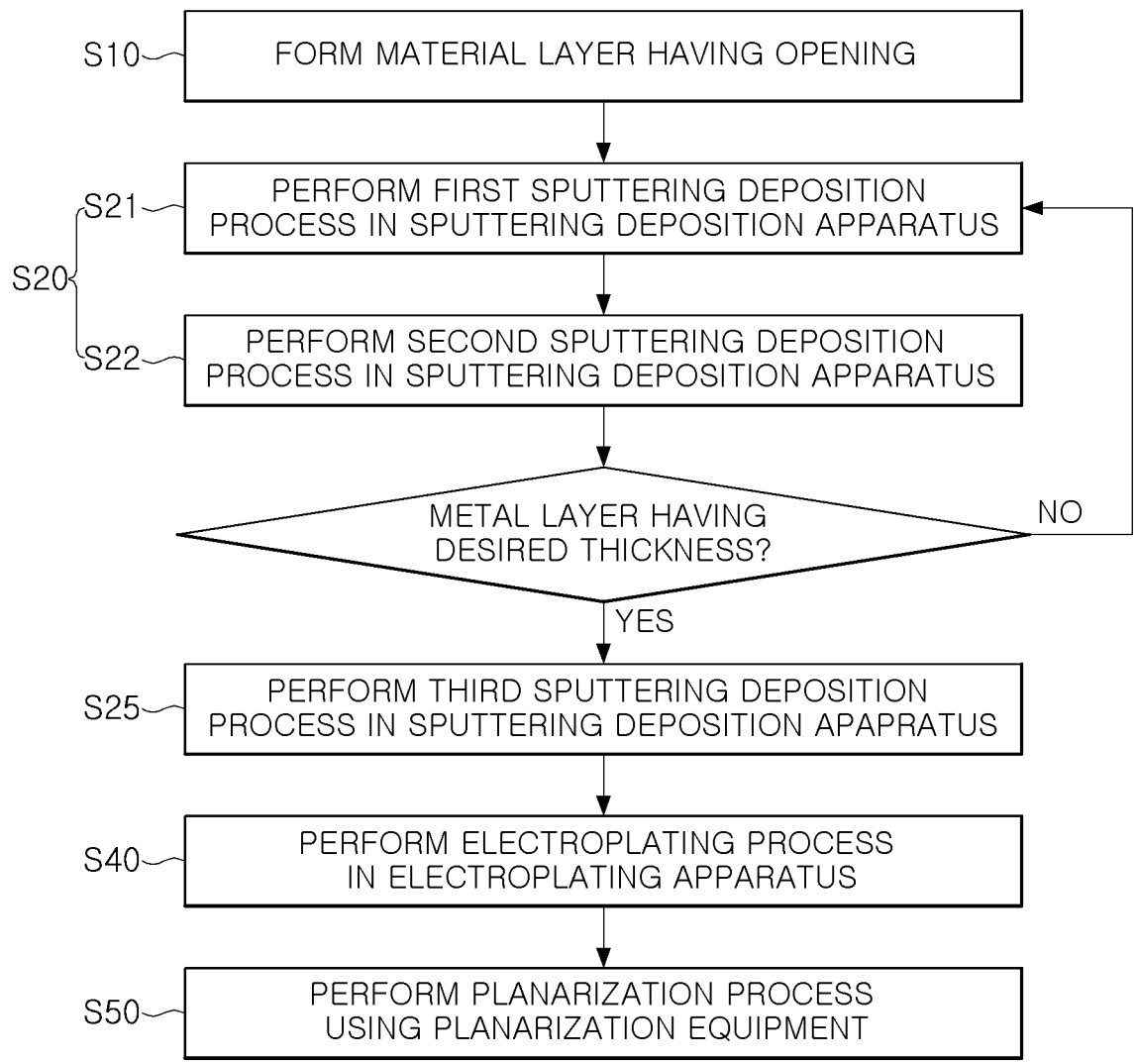
FIG. 11 is a flowchart illustrating a method of fabricating a semiconductor device according to example embodiments.
Figure 12:
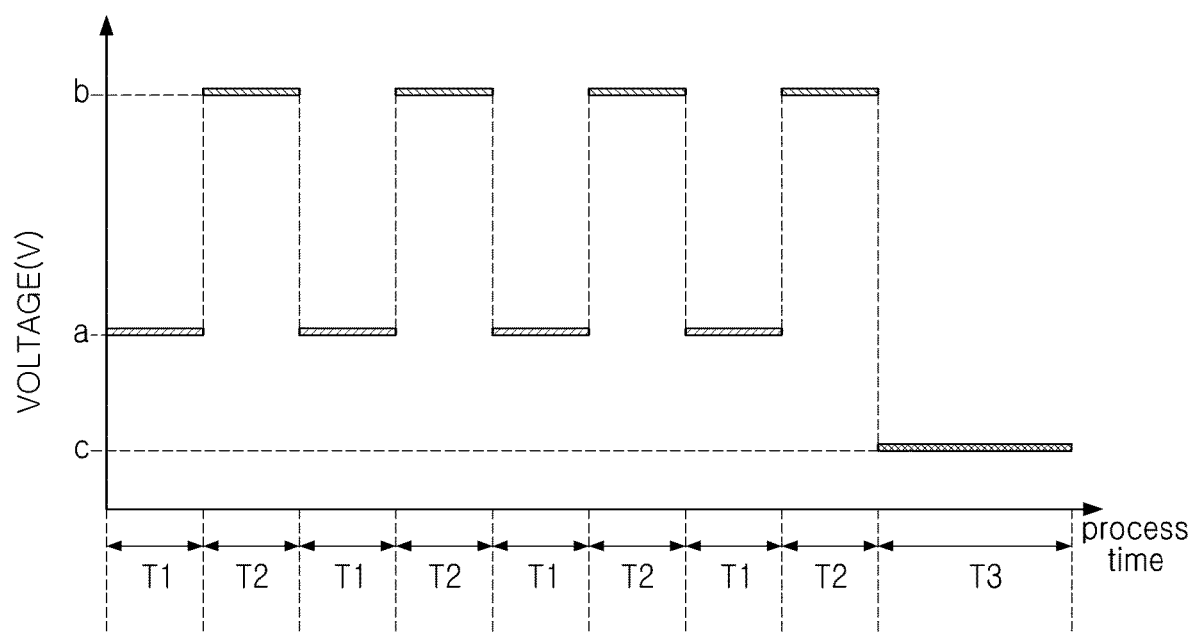
FIG. 12 is a graph illustrating a bias voltage applied over process time in a method of fabricating a semiconductor device according to example embodiments.

FIG. 11 is a flowchart illustrating a method of fabricating a semiconductor device according to example embodiments, and FIG. 12 is a graph illustrating a bias voltage applied over process time in a method of fabricating a semiconductor device according to example embodiments. In FIGS. 11 and 12, repetition of the same descriptions as provided with reference to FIGS. 2, 3, and 8 may be omitted.

Referring to FIGS. 11 and 12, a method S3 of fabricating a semiconductor device may include operation S10 in which a material layer having an opening is formed. The method S3 may include operation S21 in which a first sputtering deposition process is performed using a first bias voltage "a" in a sputtering deposition apparatus and operation S22 in which a second sputtering deposition process is performed using a second bias voltage "b" higher than the first bias voltage "a." Operations S21 and S22 may be alternately repeated to form a first metal layer 210. The method S3 may include operation S25 in which a sputtering deposition process using a third bias voltage "c" lower than the first bias voltage "a" is performed, and operation S40 in which an electroplating process is performed in an electroplating apparatus to form a second metal layer. In an example embodiment, the method S3 may further include operation S50 in which a planarization process is performed using planarization process equipment.

In operation S25, a metal material may be deposited on the first metal layer 210 using the third bias voltage "c" lower than the first bias voltage "a" and the second bias voltage "b."

As illustrated in FIG. 12, process time T1 of the first sputtering deposition process S21 may be shorter than process time T3 of the third sputtering deposition process S25, but example embodiments are not limited thereto. Process time T2 of the second sputtering deposition process S22 may be shorter than process time T3 of the third sputtering deposition process S25, but example embodiments not limited thereto.

Figure 13:
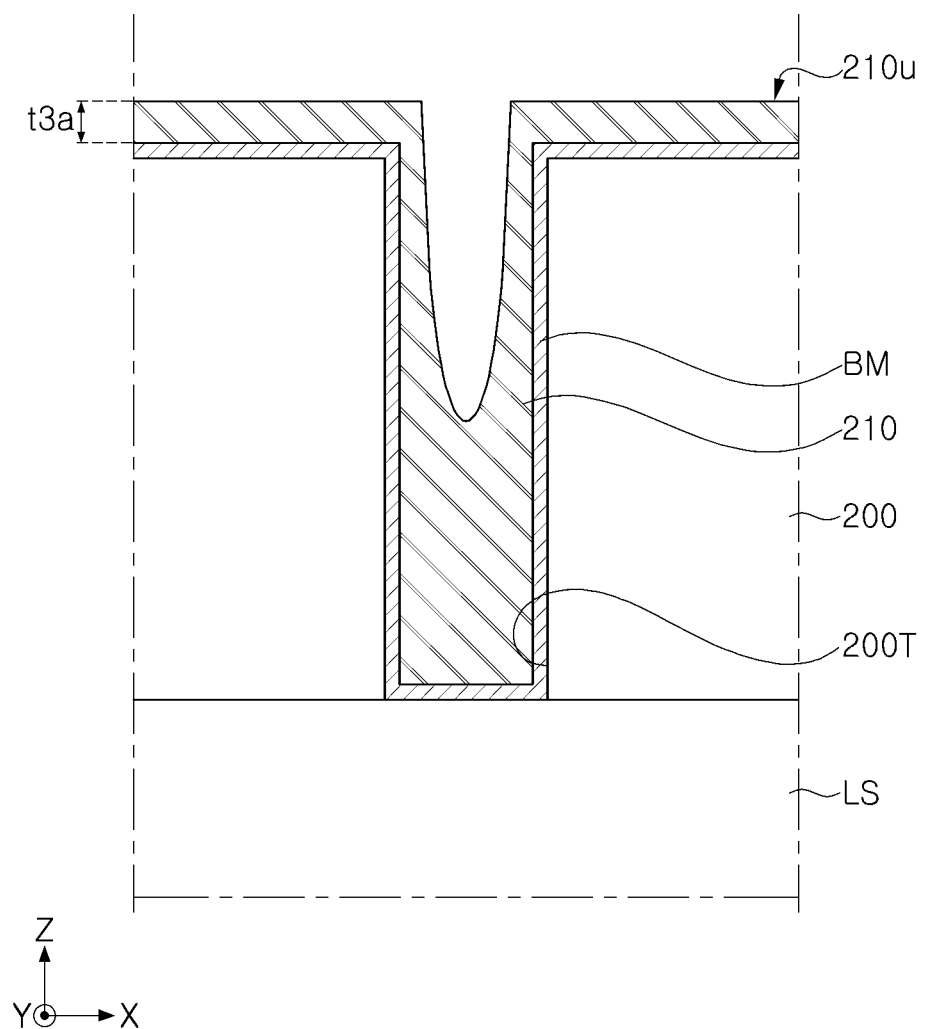
FIGS. 13 and 14 are process flow diagrams illustrating a method of fabricating a semiconductor device according to example embodiments.
Figure 14:
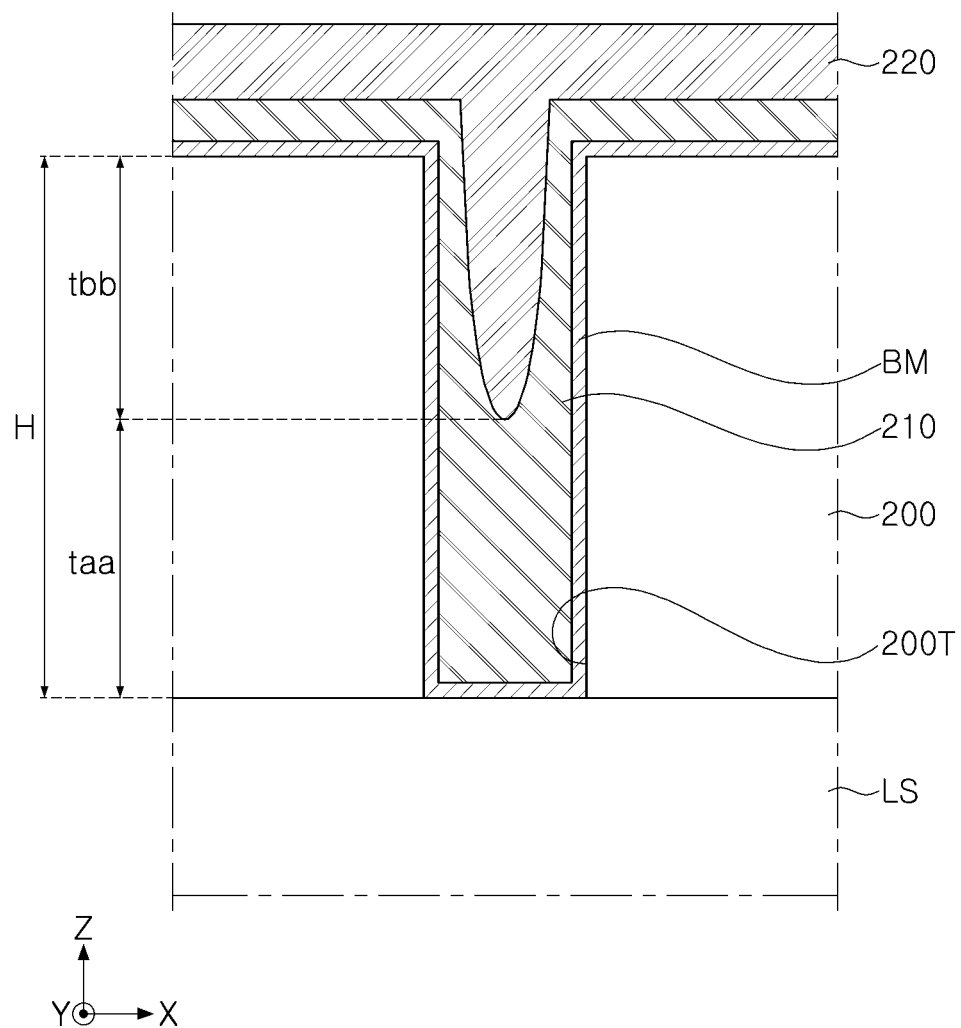

FIGS. 13 and 14 are process flow diagrams illustrating a method of fabricating a semiconductor device according to example embodiments. FIG. 13 illustrates operations subsequent to the process described with reference to FIG. 7.

Referring to FIGS. 11 and 13, in operation S25 in which the third sputtering deposition process is performed, a metal material may be additionally deposited on the first metal layer 210 using a third bias voltage "c" lower than a first bias voltage "a" (see FIG. 12) and a second bias voltage "b" (see FIG. 12).

Since the metal material is deposited using a relatively low bias voltage in operation S25, the metal material may be additionally deposited on an upper portion 210u of the first metal layer 210 disposed on an upper surface of the material layer 200 in a region other than the opening 200T. Accordingly, a thickness t3a of the upper portion 210u of the first metal layer 210 may be greater than a thickness t3 (see FIG. 7) of the upper portion 210u of the first metal layer 210 before the third sputtering process S25 is performed.

Referring to FIGS. 11 and 14, after operation S25 in which the third sputtering process is performed, the second metal layer 220 may be formed by an electroplating process in operation S40.

In an example embodiment in which the second metal layer 220 is formed after operation S25 in which the third deposition process is performed, the first metal layer 210 may have, for example, a vertical thickness taa less than or equal to about half (½) of the height of the opening 200T. In this case, the second metal layer 220 may have, for example, a vertical thickness tbb greater than or equal to about half (½) of the height H of the opening 200T. In an example embodiment in which the second metal layer 220 is formed after operation S25 in which the third deposition process is performed, the first metal layer 210 may have, for example, a vertical thickness taa less than or equal to about a quarter (¼) of the height H of the opening 200T. In this case, the second metal layer 220 may have, for example, a vertical thickness tbb more than or equal to about a three quarters (¾) of the height H of the opening 200T.

Figure 15:
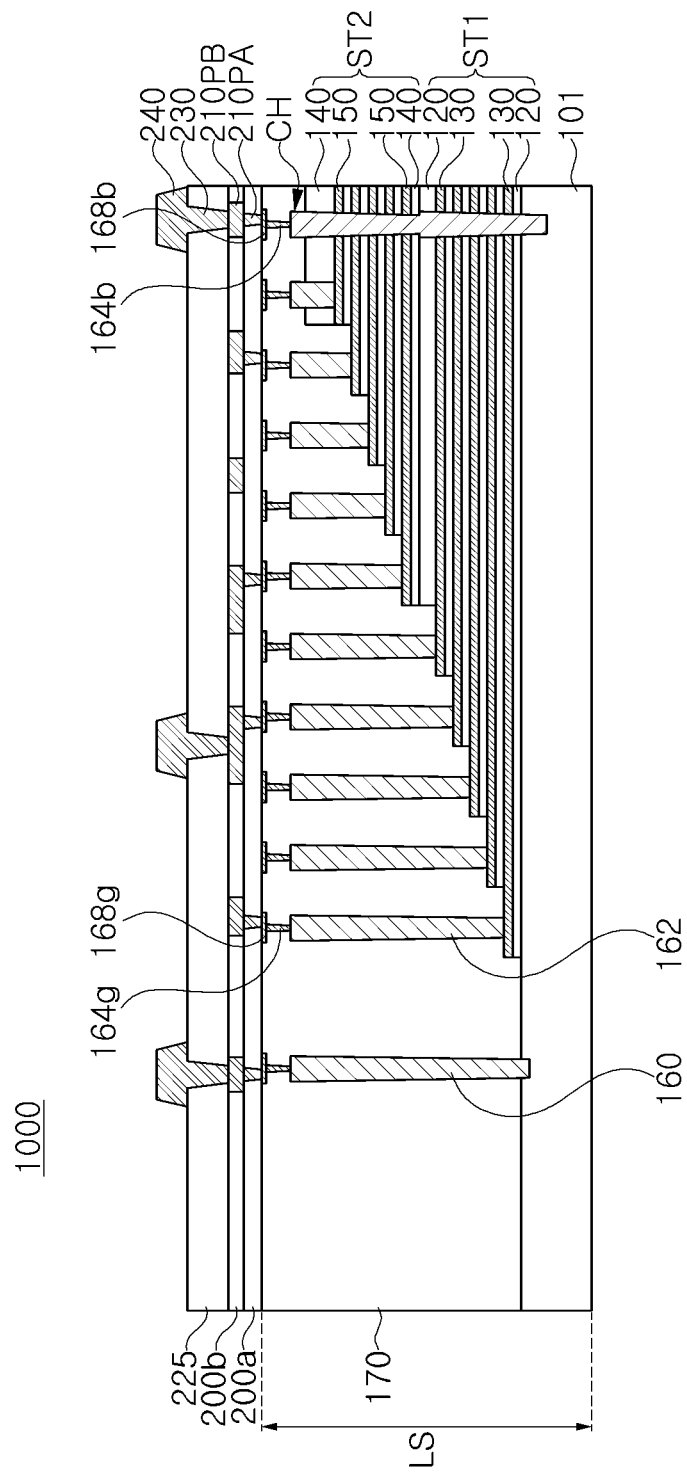
FIG. 15 is a cross-sectional view of a semiconductor device fabricated by a method according to example embodiments.

FIG. 15 is a cross-sectional view of a semiconductor device fabricated by a method according to example embodiments.

Referring to FIG. 15, a semiconductor device 1000 may include a substrate 101, a first stack structure ST1 disposed on the substrate 101, a second stack structure ST2 disposed on the first stack structure ST1, a lower structure LS including a data storage structure CH penetrating through the first stack structure ST1 and the second stack structure ST2, a first insulating layer 200a disposed on the lower structure LS, a second insulating layer 200b disposed on the first insulating layer 200a, a third insulating layer 225 disposed on the second insulating layer 200b, a first interconnection via 210PA penetrating through the first insulating layer 200a, and a first metal interconnection 210PB disposed on the first interconnection via 210PA. The semiconductor device 1000 may further include a second interconnection via 230 penetrating through the third insulating layer 225 and disposed on the first metal interconnection 210PB, and a second metal interconnection 240 disposed on the second interconnection via 230. The lower structure LS may further include a lower insulating layer 170 on (e.g., covering) the substrate 101, the first stack structure ST1, and the second stack structure ST2. The lower structure LS may further include a source contact plug 160, a gate contact plug 162, a bitline connection via 164b, a bitline 168b, a gate connection via 164g, and a gate connection line 168g.

The substrate 101 may be a semiconductor substrate. The first stack structure ST1 may include first interlayer insulating layers 120, disposed to be spaced apart from each other on the substrate 101, and first gate electrodes 130 stacked alternately with the first interlayer insulating layers 120.

The second stack structure ST2 may include second interlayer insulating layers 140 disposed to be spaced apart from each other on the first stack structure ST1, and second gate electrodes 150 stacked alternately with the second interlayer insulating layers 140.

The first and second interlayer insulating layers 120 and 140 may include an insulating material such as silicon oxide or silicon nitride.

The gate electrodes 130 and 150 may include a gate electrode constituting a gate of a ground select transistor, memory gate electrodes for forming a plurality of memory cells, and gate electrodes of a string select transistor. The number of the memory gate electrodes 130 and 150 constituting memory cells may be determined depending on data storage capacity of the semiconductor device 1000. The gate electrodes 130 and 150 may extend by different lengths to form a step structure having a staircase shape. Due to the step structure, the gate electrodes 130 and 150 may have a staircase shape in which underlying gate electrodes 130 and 150 extend further than overlying gate electrodes 130 and 150, and may provide end portions exposed upwardly from the interlayer insulating layers 120 and 140.

The gate electrodes 130 and 150 may include a metal material, for example, tungsten (W). According to example embodiments, the gate electrodes 130 and 150 may include polycrystalline silicon or a metal silicide material.

As described above, the lower structure LS of the semiconductor device 1000 includes the first stack structure ST1 including the first gate electrodes 130 and a second stack structure ST2 including the second gate electrodes 150 to constitute a two-stage gate stack structure. However, the gate stack structure of the gate electrodes 130 and 150 may have another multi-stage structure (for example, a three-stage structure or a four-stage structure). In other words, (a) the number of stack structures stacked in a direction perpendicular to the upper surface of the substrate 101 and (b) the number of data storage structures may vary.

The data storage structure CH may penetrate through the first and second gate electrodes 130 and 150 in the direction perpendicular to the upper surface of the substrate 101. The data storage structure CH may store data in a NAND flash device.

The source contact plug 160 may be in contact with the substrate 101 and may be electrically connected to the substrate 101.

The gate contact plugs 162 may be electrically connected to the first and second gate electrodes 130 and 150. For example, the gate contact plugs 162 may be electrically connected to first and second gate electrodes 130 and 150 which may be select gate electrodes and word lines among the first and second gate electrodes 130 and 150.

The source contact plug 160 and the gate contact plugs 162 may be formed of the same conductive material.

The bitline connection via 164b may electrically connect the bitline 168b and the data storage structure CH between the bitline 168b and the data storage structure CH. The gate connection via 164g may electrically connect the gate connection line 168g and the gate contact plug 162 between the gate connection line 168g and the gate contact plug 162.

The lower insulating layer 170, the first insulating layer 200a, the second insulating layer 200b, and the third insulating layer 225 may each include an insulating material.

The lower insulating layer 170, the first insulating layer 200a, the second insulating layer 200b, and the third insulating layer 225 are illustrated as being distinguished from each other. However, example embodiments are not limited thereto, and the lower insulating layer 170, the first insulating layer 200a, the second insulating layer 200b, and the third insulating layer 225 may not be distinguished from each other. For example, the lower insulating layer 170, the first insulating layer 200a, the second insulating layer 200b, and the third insulating layer 225 may include the same insulating material.

The first interconnection via 210PA and the first metal interconnection 210PB may be referred to as a connection line structure. The connection line structures 210PA and 210PB may be disposed to penetrate through the first insulating layer 200a and the second insulating layer 200b on the lower structure LS. The first interconnection via 210PA may be disposed between the first metal interconnection 210PB and the gate connection line 168g or between the first metal interconnection 210PB and the bitline 168b. The first interconnection via 210PA may electrically connect the first metal interconnection 210PB and the gate connection interconnection 168g to each other. The first interconnection via 210PA may electrically connect the first metal interconnection 210PB and the bitline 168b to each other. The first metal interconnection 210PB may be disposed on the first interconnection via 210PA. Each of the first interconnection via 210PA and the first metal interconnection 210PB may include a conductive material, for example, copper. At least one of the first interconnection via 210PA and the first metal interconnection 210PB may be formed by one of the fabricating methods described with reference to FIGS. 1 to 14.

The second interconnection via 230 may electrically connect the first metal interconnection 210PB and the second metal interconnection 240 between the first metal interconnection 210PB and the second metal interconnection 240. The second interconnection via 230 may be disposed on the first metal interconnection 210PB. The second metal interconnection 240 may be disposed on the second interconnection via 230. The second metal interconnection 240 may include a conductive material, for example, aluminum.

Figure 16:
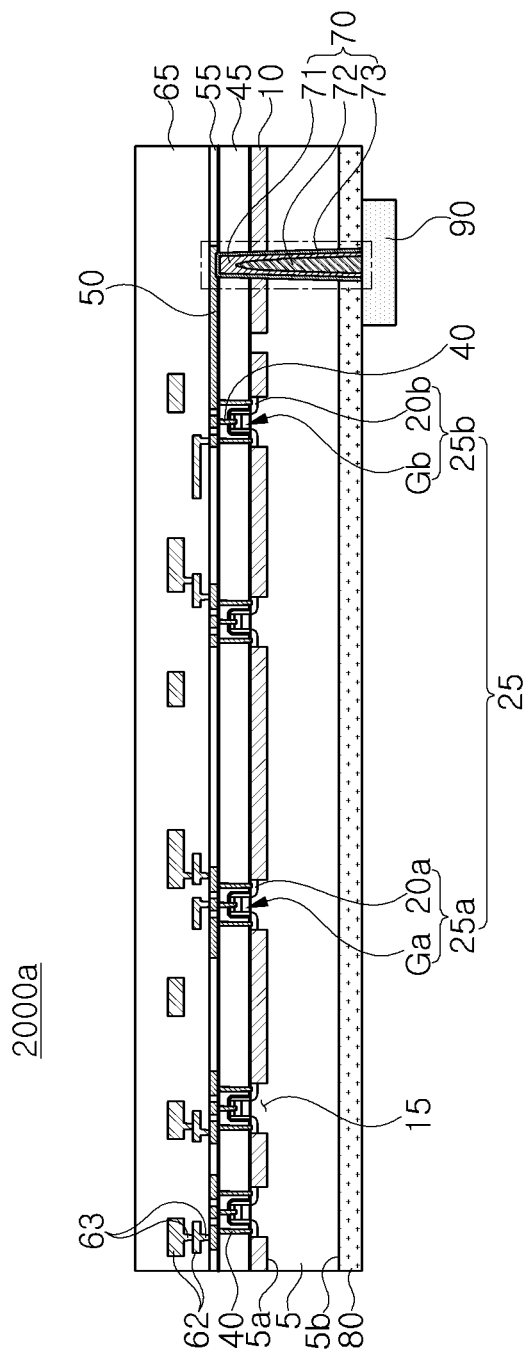
FIG. 16 is a cross-sectional view of a semiconductor device fabricated by a method according to example embodiments.

FIG. 16 is a cross-sectional view of a semiconductor device fabricated by a method according to example embodiments.

A semiconductor device 2000a may include a semiconductor substrate 5, having a first surface 5a and a second surface 5b, and a through-electrode structure 70 including a portion penetrating through the semiconductor substrate 5.

In an example embodiment, the semiconductor device 2000a may include a device isolation layer 10 on the first surface 5a of the semiconductor substrate 5 and active regions 15 defined by the device isolation layer 10. The semiconductor device 2000a may include a peripheral circuit 25 on the first surface 5a of the semiconductor substrate 5. At least some of the peripheral circuits 25 may be MOS transistors. For example, the peripheral circuit 25 may include a first circuit element 25a and a second circuit element 25b. The first circuit element 25a may include a first gate structure Ga and first source/drain regions 20a, and the second circuit element 25b includes a second gate structure Gb and second source/drain regions 20b. In example embodiments, the first circuit element 25a may be a peripheral circuit element, and the second circuit element 25b may be an input/output circuit element.

At least a portion of the first gate structure Ga may be disposed on a circuit active region 15 among the active regions 15, and the first source/drain regions 20a may be disposed in the circuit active region 15 on opposite sides adjacent to the gate structure Ga. The first gate structure Ga may include a gate dielectric layer and a gate electrode sequentially stacked on the circuit active region 15.

The semiconductor device 2000a may further include a first insulating structure 45, a second insulating structure 55, and a third insulating structure 65 sequentially stacked. Each of the first to third insulating structures 45, 55, and 65 may include an insulating material.

The semiconductor device 2000a may further include contact plugs 40 penetrating through the first insulating structure 45. The contact plugs 40 may include first contact plugs 40 that are in contact with and electrically connected to the first and second gate electrodes Ga and Gb of the peripheral circuit 25, and second contact plugs 40 that are in contact with and electrically connected to the first and second source/drain regions 20a and 20b of the peripheral circuit 25.

The semiconductor device 2000a may further include lower interconnections 50 electrically connected to the contact plugs 40, a plurality of upper interconnection vias 63 electrically connected to the lower interconnections 50, and a plurality of upper interconnections 62 electrically connected to the upper interconnection vias 63.

In example embodiments, the semiconductor device 2000a may include a rear insulating layer 80 on (e.g., covering) the second surface 5b of the semiconductor substrate 5, and an external input/output conductive pattern 90 below the rear insulating layer 80. In an example, the external input/output conductive pattern 90 may include a conductive material such as aluminum, but example embodiments are not limited thereto. The external input/output conductive pattern 90 may include a material other than aluminum, for example, copper. In one example, the rear insulating layer 80 may include an insulating material such as silicon oxide, silicon nitride, or polyimide.

In an example, at least a portion of the through-electrode structure 70 may penetrate through the rear insulating layer 80, the semiconductor substrate 5, the device isolation layer 10, and the first insulating structure 45. The through-electrode structure 70 may be in contact with and electrically connected to at least some of the lower interconnections 50.

The through-electrode structure 70 may include a through-electrode, including a first metal layer 71 and a second metal layer 72, and a barrier layer 73 on (e.g., covering) side surfaces and upper surfaces of the through-electrodes 71 and 72. The first metal layer 71 and the second metal layer 72 of the through-electrode may include a metal material, for example, copper. The barrier layer 73 may be formed as multiple layers including a metal layer such as Ti or the like, and a metal nitride layer such as TiN, TaN, WN, or the like. In another example, the barrier layer 73 may be formed of a metal nitride layer such as TiN, TaN, WN, or the like.

In an example embodiment, a width of an upper surface of the through-electrode structure 70 may be smaller than a width of a lower surface of the through-electrode structure 70. In the present embodiment, the first metal layer 71 may be disposed to be higher than the second metal layer 72 relative to the external input/output conductive pattern 90. The second metal layer 72 may be surrounded by the first metal layer 71. The barrier layer 73 may be disposed on a side surface of the through-electrode structure 70 and the lower interconnections 50, the first metal layer 71 may be disposed on the barrier layer 73, and the second metal layer 72 may be disposed on the first metal layer 71.

In an example embodiment, the first and second metal layers 71 and 72 of the through electrode structure 70 may be formed by one of the fabricating methods described with reference to FIGS. 1 to 14.

Figure 17:
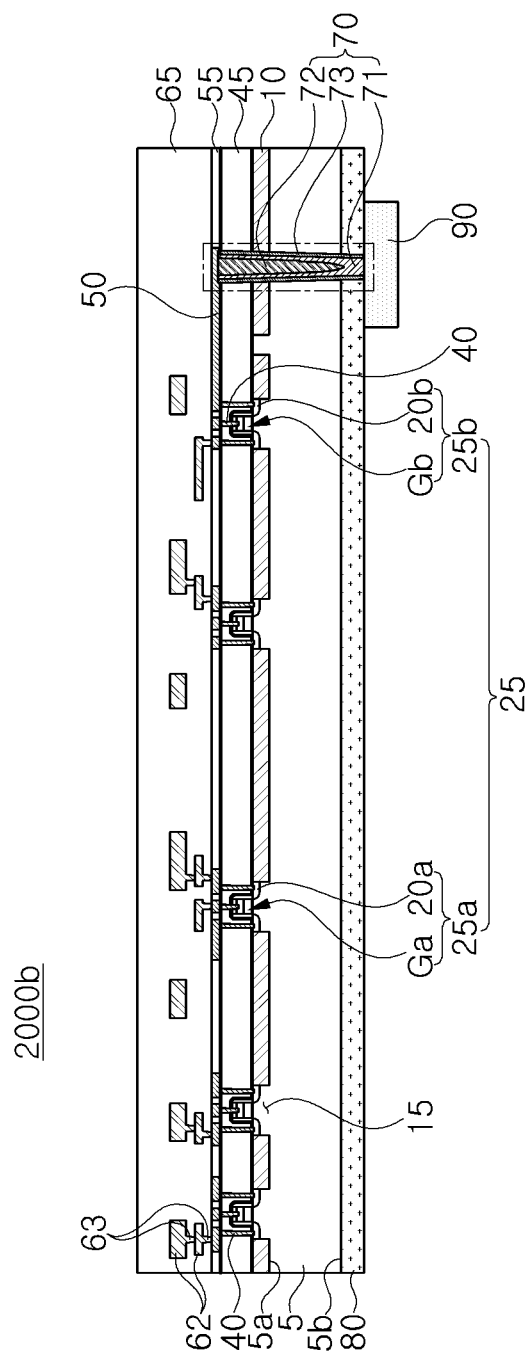
FIG. 17 is a cross-sectional view of a semiconductor device fabricated by a method according to example embodiments.

FIG. 17 is a cross-sectional view of a semiconductor device fabricated by a method according to example embodiments. In FIG. 17, repetition of the same description as provided with reference to FIG. 16 may be omitted.

Referring to FIG. 17, a width of a lower surface of a through-electrode structure 70 may be smaller than a width of an upper surface of the through-electrode structure 70. The through-electrode structure 70 may include a through-electrode, including a first metal layer 71 and a second metal layer 72, and a barrier layer 73 surrounding side surfaces of the through-electrodes 71 and 72.

In embodiments according to FIG. 17, the first metal layer 71 may be disposed to be lower than the second metal layer 72 relative to an external input/output conductive pattern 90. The second metal layer 72 may be surrounded by the first metal layer 71. A barrier layer 73 may be only disposed on a side surface of the through-electrode structure 70. The first metal layer 71 may be in contact with the external input/output conductive pattern 90. The second metal layer 72 may be in contact with an upper interconnection 50.

As described above, when a metal interconnection of a semiconductor device is formed, a sputtering process performed at a low bias voltage for a short time and a sputtering process performed at a high bias voltage for a short time may be repeatedly performed to form a metal layer having a desired (e.g., predetermined) vertical thickness in an opening.

When a through-silicon via (TSV) of a semiconductor device is formed, a sputtering process performed at a low bias voltage for a short time and a sputtering process performed at a high bias voltage for a short time may be repeatedly performed to form a metal layer having a desired (e.g., predetermined) vertical thickness in an opening.

While example embodiments have been shown and described above, it will be apparent to those skilled in the art that modifications and variations could be made without departing from the scope of the present invention as defined by the appended claims.

What is claimed is:

1. A method of fabricating a semiconductor device, the method comprising:
   forming a dielectric layer on a lower structure;
   forming an opening to penetrate through the dielectric layer;
   forming a first metal layer along a sidewall of the dielectric layer, an upper surface of the lower structure, and an upper surface of the dielectric layer, and
   depositing a metal material layer on the first metal layer;
   wherein the forming of the first metal layer comprises:
   performing a first sputtering deposition process using a first bias voltage to form a first metal pattern including a first portion on the upper surface of the dielectric layer outside of the opening, and a second portion in the opening;
   performing a second sputtering deposition process using a second bias voltage, higher than the first bias voltage, such that the first portion of the first metal pattern is partially etched and a metal is deposited in the opening by resputtering the second portion of the first metal pattern to form a second metal pattern; and
   repeatedly performing the first sputtering deposition process and the second sputtering deposition process two or more times,
   wherein the first metal layer includes first and second metal portions in the opening, the second metal portion extending upward from the first metal portion,
   wherein the first metal portion has a first thickness in a lower portion of the opening in a first direction perpendicular to the upper surface of the lower structure,
   wherein the second metal portion has a second thickness, smaller than the first thickness, in a second direction perpendicular to the sidewall of the dielectric layer; and
   wherein the depositing the metal material layer comprises:
   performing a third sputtering deposition process using a third bias voltage, lower than the first bias voltage.

2. The method of claim 1, wherein first and second process times, during which the first sputtering deposition process and the second sputtering deposition process, respectively, are performed, are each about five seconds or less.

3. The method of claim 1, wherein first and second process times, during which the first sputtering deposition process and the second sputtering deposition process, respectively, are performed, are each about two seconds or less.

4. The method of claim 1, further comprising:
   planarizing the first metal layer.

5. The method of claim 1, wherein the first metal layer includes copper.

6. The method of claim 1, wherein the first thickness is less than or equal to about half of a height of the opening.

7. The method of claim 1, wherein the first thickness is less than or equal to about a quarter of a height of the opening.

8. The method of claim 1, further comprising:
   forming a second metal layer on the first metal layer using electroplating after the first metal layer is formed; and
   planarizing the first and second metal layers to form a metal structure in the opening.

9. The method of claim 8, wherein the second metal layer includes copper.

10. The method of claim 1, wherein a process time during which the first sputtering deposition process is performed is less than a process time during which the third sputtering deposition process is performed.

11. The method of claim 1, wherein a process time during which the second sputtering deposition process is performed is less than a process time during which the third sputtering deposition process is performed.

12. The method of claim 1, wherein the lower structure includes:
   a stack structure including gate electrodes spaced apart from each other and vertically stacked interlayer insulating layers stacked alternately with the gate electrodes; and
   a data storage structure penetrating through the stack structure.

13. The method of claim 1, wherein the lower structure includes a data storage structure of a volatile memory device or a data storage structure of a nonvolatile memory device.

14. The method of claim 1, further comprising:
   forming a barrier metal layer in the opening before the first metal layer is formed.

15. A method of fabricating a semiconductor device, the method comprising:
   forming a dielectric layer on a lower structure;
   forming an opening to penetrate through the dielectric layer;

alternately repeating a first operation, in which a first sputtering deposition process using a first bias voltage is performed to form a first metal pattern along an upper surface of the lower structure and a sidewall and an upper surface of the dielectric layer, and a second operation, in which a second sputtering deposition process using a second bias voltage, higher than the first bias voltage, is performed to form a second metal pattern in the opening and on the upper surface of the dielectric layer, two or more times to form a first metal layer;

performing a third sputtering deposition process using a third bias voltage, lower than the first bias voltage, to deposit a metal material layer on the first metal layer;

forming a second metal layer on the first metal layer using electroplating; and planarizing the first and second metal layers, wherein first and second process times, during which the first sputtering deposition process and the second sputtering deposition process, respectively, are performed, are each about five seconds or less.

16. The method of claim 15, wherein each of the first and second metal layers includes copper.

17. The method of claim 15,
wherein the first metal layer has an upwardly concave surface,
wherein the first metal layer includes a first metal portion and a second metal portion extending upwardly in the opening from the first metal portion,
wherein the first metal portion has a first thickness in a lower portion of the opening in a first direction perpendicular to the upper surface of the lower structure, and wherein the second metal portion has a second thickness, smaller than the first thickness, in a second direction perpendicular to the sidewall of the dielectric layer.

18. The method of claim 17, wherein a thickness of the first metal layer is less than a thickness of the second metal layer in the opening before the first and second metal layers are planarized.

19. A method of fabricating a semiconductor device, the method comprising:

forming a material layer having an opening;

performing a first sputtering deposition process using a first bias voltage to form a first metal pattern in the opening and on an upper surface of the material layer;

performing a second sputtering deposition process using a second bias voltage, higher than the first bias voltage, to form a second metal pattern in the opening and on the upper surface of the material layer;

alternately repeating the forming of the first metal pattern and the forming of the second metal pattern two or more times to form a first metal layer;

performing a third sputtering deposition process using a third bias voltage, lower than the first bias voltage, to deposit a metal material layer on the first metal layer;

forming a second metal layer on the first metal layer using electroplating; and planarizing the first and second metal layers to form a metal structure in the opening, wherein the first metal layer includes a first metal portion in a lower portion of the opening, and a second metal portion in an upper portion of the opening, the second metal portion extending upward from the first metal portion, wherein the first metal portion has a first thickness m a first direction perpendicular to the upper surface of the material layer, wherein the second metal portion has a second thickness, smaller than the first thickness, in a second direction perpendicular to a sidewall of the material layer.

* * * * *